(12) United States Patent
Song et al.

(10) Patent No.: US 11,400,495 B2
(45) Date of Patent: Aug. 2, 2022

(54) AUTOMATED PARTICLE REMOVAL SYSTEM HAVING ANGULAR ADJUSTABILITY

(71) Applicant: ASM Technology Singapore Pte Ltd, Singapore (SG)

(72) Inventors: Keng Yew Song, Singapore (SG); Chin Tiong Ong, Singapore (SG); Soo Kin (Kenny) Tan, Singapore (SG); Qing Le Tan, Singapore (SG); Gang Shu, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 17/015,133

(22) Filed: Sep. 9, 2020

(65) Prior Publication Data

US 2022/0073286 A1    Mar. 10, 2022

(51) Int. Cl.
| | |
|---|---|
| *B08B 1/00* | (2006.01) |
| *B08B 7/00* | (2006.01) |
| *B65G 47/90* | (2006.01) |
| *H01L 21/02* | (2006.01) |
| *G01N 21/94* | (2006.01) |

(52) U.S. Cl.
CPC .......... *B08B 7/0028* (2013.01); *B08B 1/001* (2013.01); *B65G 47/90* (2013.01); *H01L 21/02041* (2013.01); *H01L 21/02057* (2013.01); *G01N 21/94* (2013.01)

(58) Field of Classification Search
None
See application file for complete search history.

(56) References Cited

U.S. PATENT DOCUMENTS

| | | | |
|---|---|---|---|
| 6,175,984 B1* | 1/2001 | Prime | B08B 7/0028 15/104.002 |
| 10,507,569 B1* | 12/2019 | Marotta | A46B 13/02 |
| 2002/0101584 A1* | 8/2002 | Batchelder | G01N 21/94 356/237.1 |
| 2006/0054189 A1* | 3/2006 | Luke | B08B 9/08 134/22.1 |
| 2018/0267252 A1* | 9/2018 | Takano | G02B 6/3866 |
| 2021/0227952 A1* | 7/2021 | Stiehl | A61B 17/32 |

* cited by examiner

*Primary Examiner* — Mikhail Kornakov
*Assistant Examiner* — Ryan L Coleman
(74) *Attorney, Agent, or Firm* — Ostrolenk Faber LLP

(57) ABSTRACT

A foreign particle removal system for removing a foreign particle from a surface of an object has a tool gripper which grips a particle removal tool. A tip of the particle removal tool has a sticky tip portion. The sticky tip portion has an apex region at a remote end of the sticky tip portion and a flank region adjoining the apex region. The tool gripper holds the particle removal tool at an oblique angle with respect to the surface so that the flank region of the sticky tip portion faces towards the surface. The tilted particle removal tool is conveyed with the tool gripper to contact the foreign particle on the surface with the flank region of the sticky tip portion and a force is exerted onto the surface to attract the foreign particle onto the flank region. The particle removal tool may then be lifted away from the surface together with the foreign particle.

7 Claims, 6 Drawing Sheets

AUTOMATED PARTICLE REMOVAL SYSTEM HAVING ANGULAR ADJUSTABILITY

FIELD OF THE INVENTION

The invention relates to the removal of foreign particles, and in particular, small debris from fragile surfaces.

BACKGROUND AND PRIOR ART

CMOS (complementary metal oxide semiconductor) sensors are used to optically capture images in digital cameras. In the semiconductor industry, foreign particles (particularly debris) on CMOS sensor surfaces during the manufacture of CMOS sensors are strictly controlled and should be eliminated in the manufactured product. Although cleaning using chemicals or water is typically conducted to wash foreign particles away from the CMOS sensor surface, physical inspection should also be performed to inspect the sensor surface thereafter for the presence of foreign particles, as these might adversely affect the quality of images captured by the CMOS sensor.

Such inspection of the CMOS sensor surface for foreign particles may be conducted manually by human operators or automatically by Automated Optical Inspection ("AOI") devices. If foreign particles are found, a human operator will typically use a suitable tool to manually remove such particles individually.

One concern with the aforesaid approach is that the CMOS sensor may be damaged during the removal of particles when using a tool to pick up these particles, as such tools will typically make contact with the CMOS sensor surface. Meanwhile, manual removal of particles is also a slow and laborious process.

A prior art cleaning apparatus utilizes a vertically arranged particle removal tool which is adapted to exert a force on the particle removal tool to lift the foreign particles from the surface of an object. In such a cleaning apparatus, the effective cleaning area of the particle removal tool is at an apex of a tip of the particle removal tool. While this method may be useful to prevent the fragile surfaces from being damaged, it is a waste of resources as only the apex region of the particle removal tool is utilized. Hence, such particle removal tools are consumables which have short life spans and are replaced after a few cleaning cycles.

Furthermore, when there are many foreign particles or especially if is a large foreign particle to be cleaned from the surface of the object, an entire cleaning area of the particle removal tool may be covered by foreign particles. The risk of contamination of the surface or another part of the surface by using a same cleaning area of the particle removal tool will increase. The life span of the particle removal tool is also short as only a small surface area of the tip (at the apex) of the particle removal tool may be used. Hence, the particle removal tool is not fully utilized, resulting in wastage of resources. Further, where there are stubborn or sticky foreign particles that are residual on the surfaces, cleaning efficiency of the particle removal tool may be limited.

It would be beneficial to provide an automated method and process which avoids and overcomes these shortcomings.

SUMMARY OF THE INVENTION

It is thus an object of the present invention to seek to provide an automated method and apparatus for removing foreign particles with appropriate force control mechanisms to prevent inadvertent damage being done to the CMOS sensor surface, and yet maximize the usage and cleaning yield of each particle removal tool before it has to be replaced.

According to a first aspect of the invention, there is provided a method for removing a foreign particle from a surface of an object, the method comprising the steps of: gripping a particle removal tool with a tool gripper, a tip of the particle removal tool including a sticky tip portion, the sticky tip portion further having an apex region at a remote end of the sticky tip portion and a flank region adjoining the apex region; holding the particle removal tool with the tool gripper at an oblique angle with respect to the surface so that the flank region of the particle removal tool faces towards the surface; conveying the tilted particle removal tool with the tool gripper to contact the foreign particle on the surface with the flank region of the particle removal tool and exerting a force onto the surface to attract the foreign particle onto the flank region; and lifting the particle removal tool and the foreign particle away from the surface.

According to a second aspect of the invention, there is provided an apparatus for removing a foreign particle from a surface of an object, the apparatus comprising: a tool gripper which is operative to grip a particle removal tool, a tip of the particle removal tool including a sticky tip portion, the sticky tip portion further having an apex region at a remote end of the sticky tip portion and a flank region adjoining the apex region; an alignment actuator coupled to a tool gripper arm of the tool gripper, wherein the alignment actuator is operative to drive the tool gripper to orientate the particle removal tool at an oblique angle with respect to the surface, so that the flank region of the particle removal tool faces the surface for contacting and exerting a force on the foreign particle, whereby to attract the foreign particle onto the flank region for lifting the foreign particle that is attracted onto the flank region away from the surface.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of methods and apparatus for the removal of foreign particles from an object surface in accordance with the invention will now be described with reference to the accompanying drawings, in which.

DETAILED DESCRIPTION OF THE PREFERRED EMBODIMENTS

Figure 1:
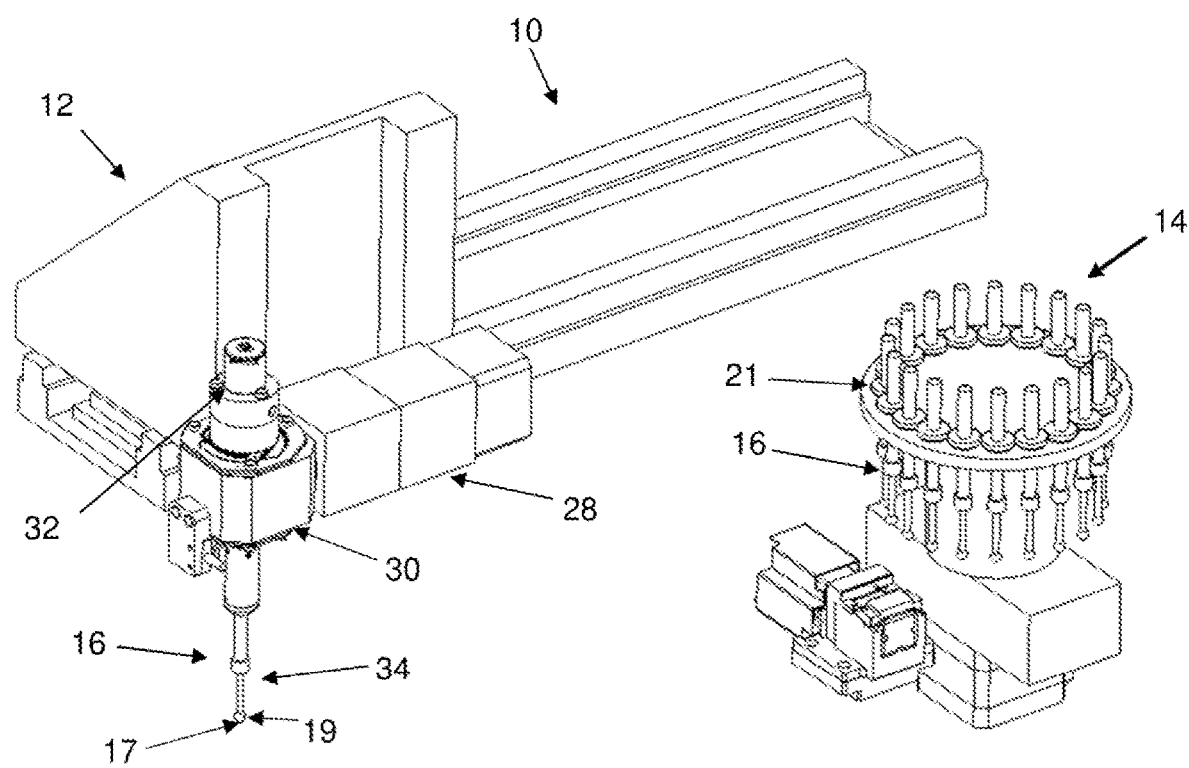
FIG. 1 is an overview of a cleaning apparatus comprising a particle removal system for removing a foreign particle from a surface of an object.

FIG. 1 is an overview of a cleaning apparatus 10 comprising a particle removal system for removing a foreign particle from a surface of an object. The cleaning apparatus 10 generally comprises a particle removal unit 12, a cleaning tool station 14 which contains a supply of multiple particle removal tools 16, and an optical device such as an up-look optical device. In the illustrated embodiment, the particle removal tools 16 are in the form of gel sticks 34, wherein a gel-like substance is attached to one end of a stick and the gel stick 34 is attached to a stick holder 32. A tool gripper 30 is supported by a tool gripper arm 28, and grips onto a portion of the stick holder 32 which has been adapted for this purpose. The gel-like substance is sticky and is operative to attract small foreign particles and to remove them from surfaces of objects. In the illustrated embodiment, the gel stick 34 has a sticky tip portion comprising an apex region 17 at a remote end of the sticky tip portion and a flank region 19 adjoining the apex region 17.

The usage of gel sticks 34 to remove foreign particles from the surfaces of objects helps to prevent damage to the surfaces. However, the invention is not intended to be limited to particle removal tools in the form of gel sticks.

Figure 2:
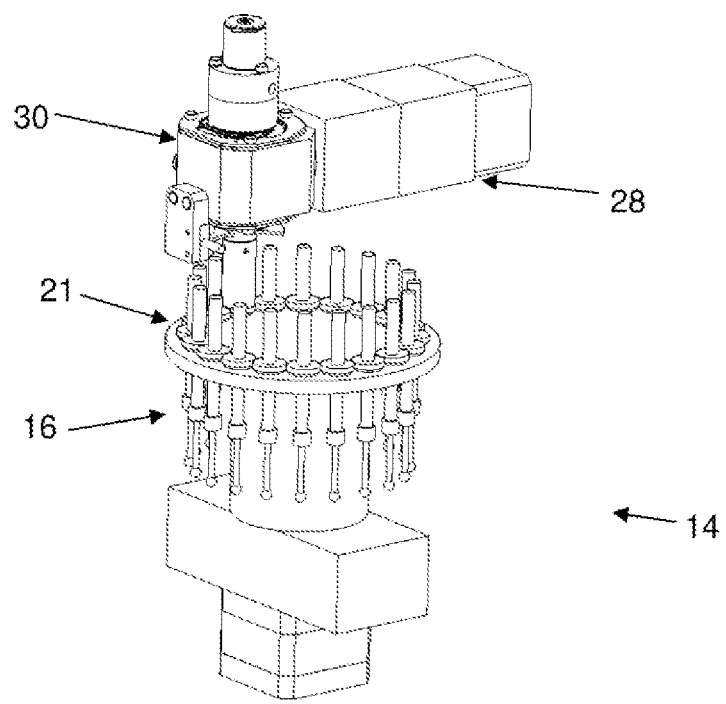
FIG. 2 is an isometric view of a tool gripper gripping a particle removal tool resting on a tool holder at the cleaning tool station.

FIG. 2 is an isometric view of a tool gripper 30 gripping a particle removal tool 16 resting on a tool holder 21 at the cleaning tool station 14. A tool gripper motor (not shown) of the tool gripper 30 has actuated the tool gripper 30 to grip onto a particle removal tool 16 at the cleaning tool station 14. The tool holder 21 is mounted onto a rotary turret and adapted to receive multiple particle removal tools 16 spaced along its perimeter. The tool holder 21 is operative to rotate about a longitudinal axis of the rotary turret. A rotary motor (not shown) is operatively connected to the rotary turret to rotate the particle removal tool 16 to a "pick-up" position, whereby the tool gripper 30 is vertically aligned with a particle removal tool 16. The tool gripper 30 then grips and lifts the particle removal tool 16 vertically away from the tool holder 21.

Figure 3:
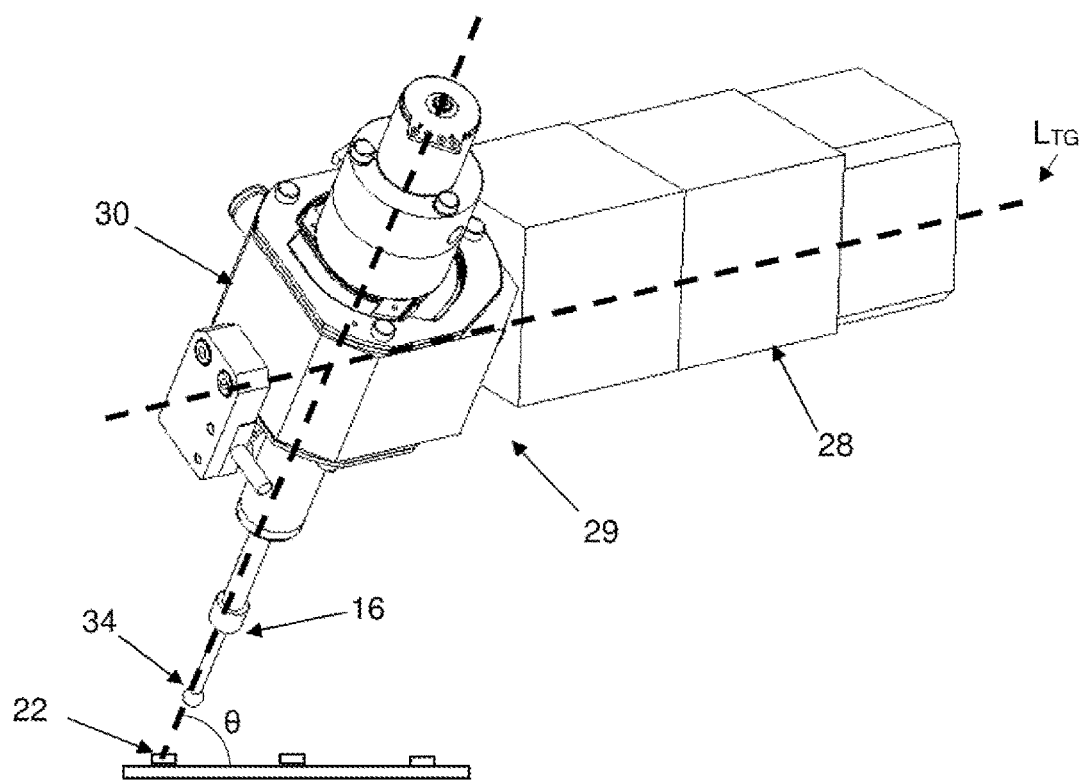
FIG. 3 is an isometric view of the tool gripper holding the particle removal tool at an oblique angle with respect to the surface of the object.

FIG. 3 is an isometric view of the tool gripper 30 holding the particle removal tool 16 at an oblique angle with respect to a surface of an object. After the particle removal tool 16 has been removed from the tool holder 21, it is tilted by the tool gripper 30. The tool gripper 30 is operatively connected to a tool gripper arm 28 having a longitudinal axis $L_{TG}$, and is driven by an alignment actuator, such as an alignment rotary motor 29 coupled to the tool gripper arm 28. The alignment rotary motor 29 drives the tool gripper 30 to rotate about the longitudinal axis $L_{TG}$ of the tool gripper arm 28 such that the particle removal tool 16 is tilted at an oblique angle θ with respect to the surface of the CMOS sensor 22, so that the flank region 19 of the gel stick 34 faces the surface at a pre-clean Z position. The angle of tilt θ may be programmable by a user and is preferably between 20° to 70°. More advantageously, the angle of tilt θ may be between 40° to 50°.

Orienting the particle removal tool 16 at a tilted angle θ increases a total number of useful cleaning areas on the particle removal tool by up to 4.5 times and increases a useful life span of each particle removal tool 16. This maximizes the usage and cleaning yield of each particle removal tool 16 before it has to be replaced. This may lead to substantial cost savings for the user.

Figure 4:
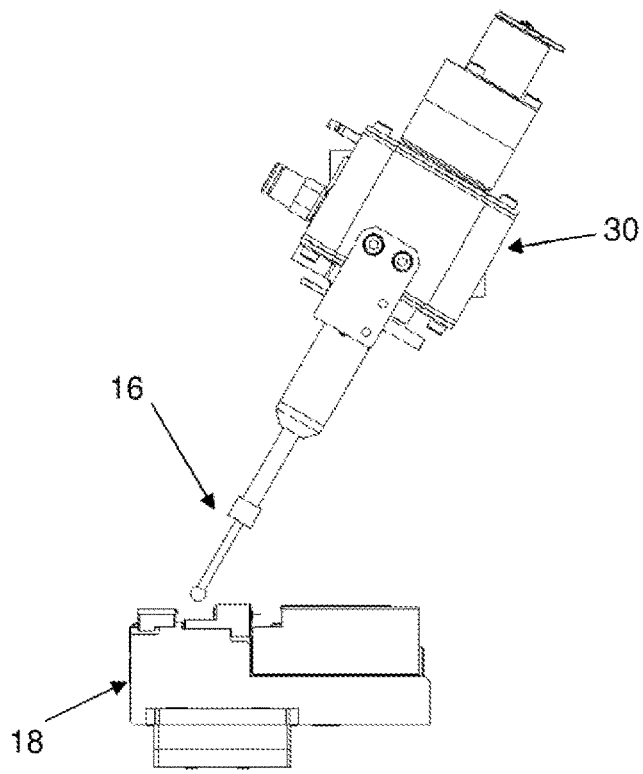
FIG. 4 is a side view of a tilted particle removal tool located over an up-look optical device during a positioning calibration.

FIG. 4 is a side view of a tilted particle removal tool 16 located over an up-look optical device 18 during a positioning calibration. After the tool gripper 30 has tilted the particle removal tool 16 to a predetermined tilting angle, the particle removal tool 16 gripped by the tool gripper 30 is then moved to a position of an up-look optical device 18 to determine a horizontal position of the apex region 17 of the tilted gel stick 34, so that a horizontal position of the flank region 19 of the tilted gel stick 34 is also ascertained.

Figure 5A:
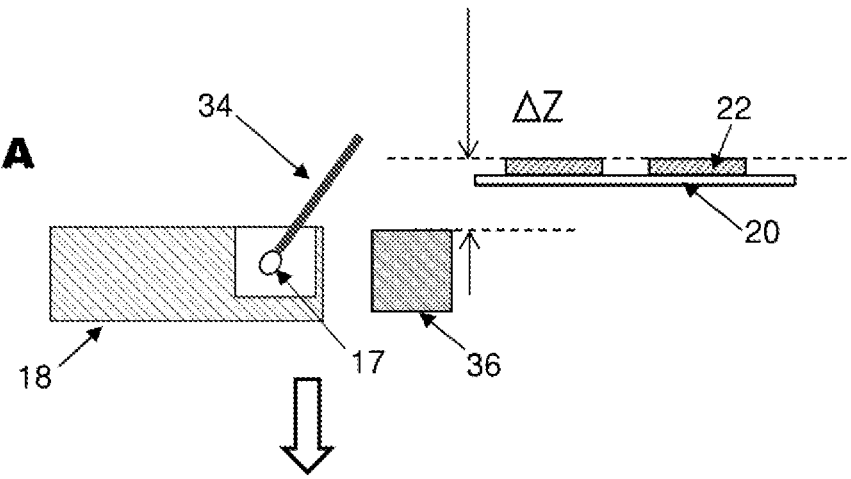
FIGS. 5A to 5C illustrate an exemplary operational sequence of the particle removal system.
Figure 5B:
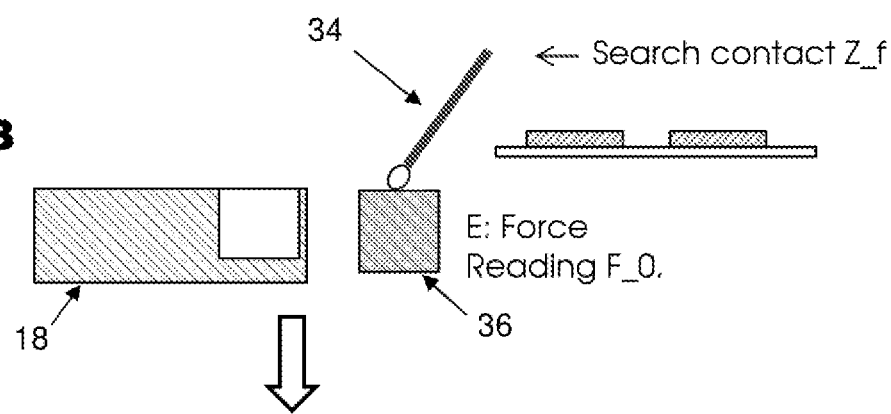
Figure 5C:
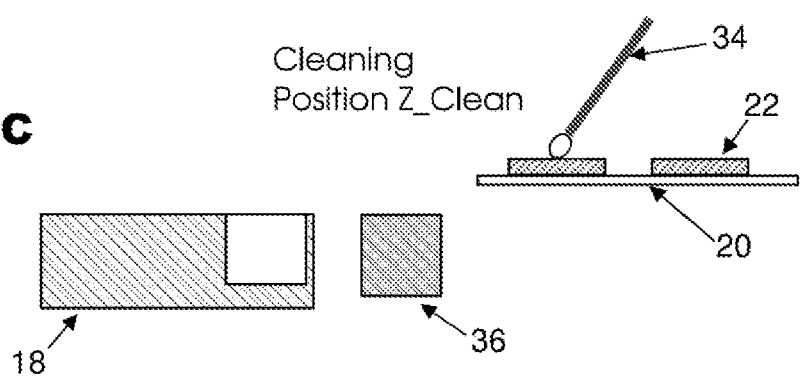

FIGS. 5A to 5C illustrate an exemplary operational sequence of the particle removal system. In FIG. 5A, the tilted gel stick 34 is moved by the tool gripper 30 to a position above the up-look optical device 18 and a horizontal (X-Y) position of the apex region 17 of the gel stick 34 is determined by the up-look optical device 18. A difference in height between coplanar top surfaces of the CMOS sensors 22 and a top surface of an external force sensor 36 (ΔZ) is measured by a displacement sensor (not shown). The difference in the level of the external force sensor 36 and of the device to be cleaned (ΔZ) is noted.

In FIG. 5B, after the horizontal position of the apex region 17 of the tilted gel stick 34 has been determined, the tilted gel stick 34 is conveyed to above the external force sensor 36 and the tilted gel stick 34 is gradually lowered to search for contact with the external force sensor 36. In this search phase, there is no force exerted on the external force sensor 36. After contact between the tilted gel stick 34 and the external force sensor 36 has been established and the tilted gel stick 34 is lowered until a desired force reading F_0 is reached, a processor (not shown) coupled to the tool gripper 30 records a current encoder position Z_f of the tool gripper 30, where the force F_0 is reached.

In FIG. 5C, the tilted gel stick 34 is moved to a vertical cleaning position Z_Clean for cleaning a CMOS sensor 22 where foreign particles have been located, where: Z_Clean=Z_f+ΔZ.

In particular, the tilted gel stick 34 is moved to the determined vertical cleaning position Z_Clean relative to coplanar top surfaces of the CMOS sensors 22 for attracting foreign particles, and the tilted gel stick 32 is then lifted away from the CMOS sensors 22 to remove the foreign particles. At the vertical cleaning position Z_Clean, the contact force exerted is equal to a threshold force, which would be a force that is exerted by the tilted gel stick 34 on the surfaces of the CMOS sensors 22 that would pick up the foreign particles but would not damage the CMOS sensors 22.

Figure 6:
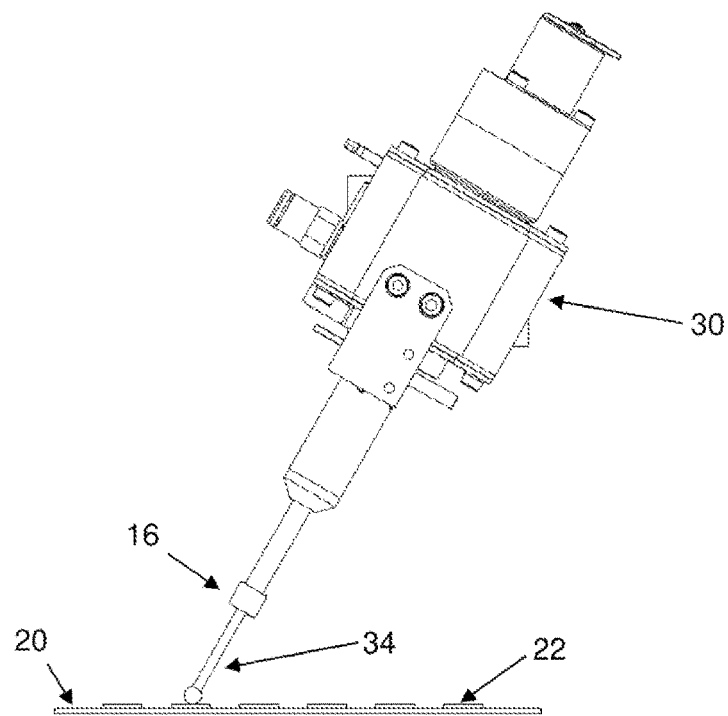
FIG. 6 is a side view of a tilted particle removal tool in a cleaning position wherein a flank region of the particle removal tool is made to contact a foreign particle on the surface of the object.

FIG. 6 is a side view of a tilted particle removal tool 16 in the cleaning position wherein a flank region 19 of the particle removal tool 16 is made to contact a foreign particle on the surface of the object 22. For the purpose of identifying foreign particles on inspected fragile objects, such as CMOS sensors 22 that are arranged and carried on a carrier 20, the carrier 20 may be placed under an AOI device for prior inspection of the CMOS sensors 22 before removing foreign particles from them.

After the AOI device has inspected the surfaces of the CMOS sensors 22 arranged on the carrier 20, locations of foreign particles on the CMOS sensors 22 would be ascertained and noted. The tilted gel stick 34 is conveyed by the tool gripper 30 over such locations where the foreign particles are found, and the tilted gel stick 34 is moved towards the surfaces of the CMOS sensors 22 by lowering the tilted gel stick 34 onto the said locations to the cleaning position whereat the threshold force is exerted on the surfaces to attract and to remove the foreign particles.

The tilted gel stick 34 is then lifted up to the pre-clean Z position and may be used in a further cleaning cycle. A portion of the flank region 19 of the gel stick 34 may be used for a fixed number of times before the used portion of the flank region 19 needs to be substituted.

Figure 7:
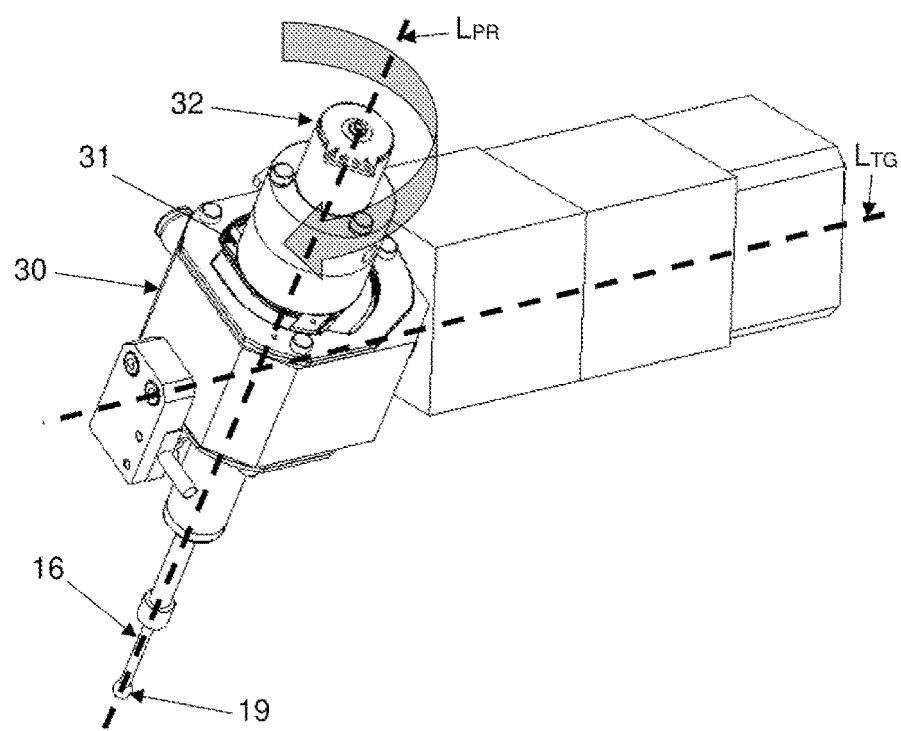
FIG. 7 is an isometric view of the tool gripper which is operative to rotate the particle removal tool about its longitudinal axis such that an unused portion of a flank region of the particle removal tool faces the surface of the object for conducting a further cleaning cycle.

FIG. 7 is an isometric view of the tool gripper 30 which is operative to rotate the particle removal tool 16 about its longitudinal axis $L_{PR}$ such that an unused portion of a flank region 19 of the particle removal tool 16 faces the surface of the object 22 for conducting a further cleaning cycle. A rotary motor 31 that is operatively connected to the stick holder 32 drives the stick holder 32 to rotate about a longitudinal axis $L_{PR}$ of the particle removal tool 16. When the particle removal tool 16 is at the pre-clean Z position, the stick holder 32 is operative to rotate the tilted gel stick 34 about its longitudinal axis $L_{PR}$ by a predetermined angle such that an unused and clean portion of the flank region 19 of the tilted gel stick 34 is facing the surface of the CMOS sensor 22. The tilted gel stick 34 can then be used to lift another foreign particle away from the surface. The longitudinal axis $L_{TG}$ of the tool gripper arm 23 and the longitudinal axis $L_{PR}$ of the particle removal tool 16 are substantially perpendicular to one another.

The cleaning cycle can then be repeated on the same tilted gel stick 34, preferably until all the used portions of the flank region 19 of the tilted gel stick 34 have been utilized. For this purpose, the tilted gel stick may be rotated up to 360° to use up all the different cleaning areas of the flank region 19. The usage of a tilted and rotatable gel stick increases the effective number of cleaning areas available for each gel stick. Furthermore, such usage eliminates the risk of contamination of the surfaces of the CMOS sensors 22. The tool gripper 30 is then operative to deposit the used gel stick 34 in the tool holder 21 at the cleaning tool station 14 and retrieve a new gel stick 34 for commencing a new cleaning cycle.

Figure 8:
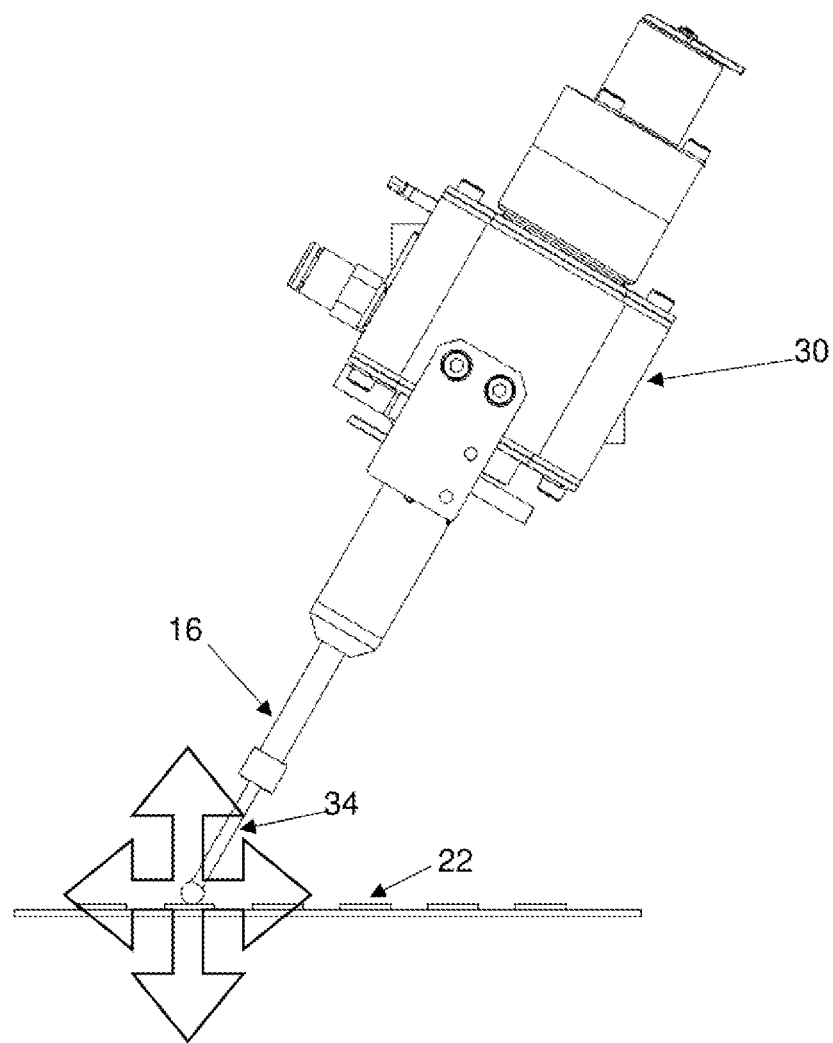
FIG. 8 is a side view of the tool gripper which is operative to drive the particle removal tool to scrub residual foreign particles from the surface of an object.

FIG. 8 is a side view of the tool gripper 30 which is operative to drive the particle removal tool 16 to scrub residual foreign particles from the surface of an object 22. In some instances, foreign particles may be difficult to remove totally by simply contacting them and lifting them with the tilted gel sticks 34. In such cases, the foreign particles may remain partially or totally adhered to the surface of the CMOS sensor 22 even after the gel stick 16 has been lifted. In such instances, the tool gripper 30 may further be coupled to an XY driving mechanism (not shown), and the XY driving mechanism is operative to provide a scrubbing action to attract the foreign particles onto the flank region 19 of the tilted gel stick 34, and thereby removing the foreign particles from the surface of the object.

As an alternative to the scrubbing motion of the tilted gel stick 34 on foreign particles stubbornly adhering to the surface of the CMOS sensor 22, the tool gripper 30 may be operative to drive the tilted gel stick 34 to exert an increasing force in predetermined increments until a threshold force is exerted on the foreign particle. The incremental forces applied by the tilted gel stick 34 onto the foreign particle each time allows the gel-like substance on the flank region 19 of the tilted gel stick 34 to increase its adhesion to the foreign particles and promotes lifting of the foreign particles from the surface of the CMOS sensor 22.

It should be appreciated that the preferred embodiments of the invention provides an automated foreign particles removal system. The preferred embodiments of the invention allow the life span of each particle removal tool 16 to be increased. A much higher usage and cleaning yield of each particle removal tool 16 is achieved before it has to be replaced. This can lead to substantial cost savings for the user. Further and as explained above, this also reduces the risk of contamination by foreign particles on other surfaces of the CMOS sensors 22, which results in a higher throughput and product yield.

The invention described herein is susceptible to variations, modifications and/or additions other than those specifically described and it is to be understood that the invention includes all such variations, modifications and/or additions which fall within the spirit and scope of the above description.

The invention claimed is:

1. An automated method for removing a foreign particle from a surface of an object, the method comprising the steps of:
   gripping a particle removal tool with a tool gripper which is operatively connected to an alignment actuator, a tip of the particle removal tool including a sticky tip portion, the sticky tip portion further having an apex region at a remote end of the sticky tip portion and a flank region adjoining the apex region;
   driving the tool gripper with the alignment actuator to tilt the particle removal tool at an oblique angle with respect to the surface so that the flank region of the particle removal tool faces towards the surface;
   conveying the tilted particle removal tool with the tool gripper to contact the foreign particle on the surface with the flank region of the particle removal tool and exerting a force onto the surface to attract the foreign particle onto the flank region; and
   lifting the particle removal tool away from the surface with the tool gripper to remove the foreign particle from the surface.

2. The method of claim 1, wherein the particle removal tool has a longitudinal axis, and the method further comprises the step of rotating the tilted particle removal tool with the tool gripper about the longitudinal axis so as to position an unused portion of the flank region of the particle removal tool to face the surface, and lifting another foreign particle away from the surface.

3. The method of claim 1, further comprising the step of driving the particle removal tool with an XY driving mechanism coupled to the tool gripper to scrub the surface with the particle removal tool for attracting the foreign particle onto the flank region.

4. The method of claim 1, wherein the particle removal tool is gripped by the tool gripper when the particle removal tool is stored at a cleaning tool station containing a supply of multiple particle removal tools.

5. The method of claim 1, further comprising the step of determining a position of the apex region of the tilted particle removal tool with an optical device prior to conveying the particle removal tool to contact the foreign particle.

6. The method of claim 1, wherein the sticky tip portion of the particle removal tool comprises a gel-like substance attached to one end of a stick.

7. The method of claim 1, further comprising the step of applying a force in predetermined increments until a threshold force is exerted on the foreign particle by the particle removal tool for attracting the foreign particle onto the flank region.

\* \* \* \* \*